US012791595B1

(12) United States Patent
Tsironis

(10) Patent No.: US 12,791,595 B1
(45) Date of Patent: Nov. 10, 2026

(54) WIDEBAND MIXED MODE HARMONIC TUNER

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 129 days.

(21) Appl. No.: 18/982,515

(22) Filed: Dec. 16, 2024

(51) Int. Cl.
*G01R 35/00* (2006.01)
*G01R 27/28* (2006.01)

(52) U.S. Cl.
CPC ........... *G01R 27/28* (2013.01); *G01R 35/005* (2013.01)

(58) Field of Classification Search
CPC ...... G01R 27/28; G01R 27/32; G01R 35/005; G01R 31/2822; G01R 29/0878
See application file for complete search history.

(56) References Cited

U.S. PATENT DOCUMENTS 7,053,628 B1 5/2006 Tsironis
9,625,556 B1 4/2017 Tsironis
10,097,165 B1 * 10/2018 Tsironis .................... H01P 5/04
10,187,228 B1 * 1/2019 Tsironis ............. G01R 31/2614
11,119,136 B1 * 9/2021 Tsironis ................. G01R 27/06
11,480,610 B1 * 10/2022 Tsironis ................. G01R 27/32

OTHER PUBLICATIONS

"Computer controlled microwave tuner CCMT", Product Note 41, Focus Microwaves, Jan. 1998.
"MPT, a universal Multi-Purpose Tuner", product note 79, Focus Microwaves Inc., Oct. 2004.
"Three probe tuners tackle multiple tasks", Microwaves & RF Magazine, Feb. 2005, p. 90ff.

* cited by examiner

*Primary Examiner* — Thang X Le

(57) ABSTRACT

Mixed mode automatic harmonic slide screw impedance tuners include a multitude of independently controlled tuning slugs, which are individually selected, one set of two large slugs covering a basic low frequency range F1 to F2>F1 and one short slug covering an extended high frequency band 3F1 to 3F2. The two large (low frequency) slugs cover at least one octave harmonic tuning from Fo to 2Fo. The third, short (high frequency) slug covers only 3Fo and adds only a single reflection factor vector, avoiding the multi positioning search strategy needed for the octave harmonic tuning of the two low frequency slugs. This allows better performance and easier alignment of all slugs who now must cover only part of the frequency range (F1 to 2F2 and 3F1 to 3F2 instead of continuous F1 to 3F2).

6 Claims, 12 Drawing Sheets

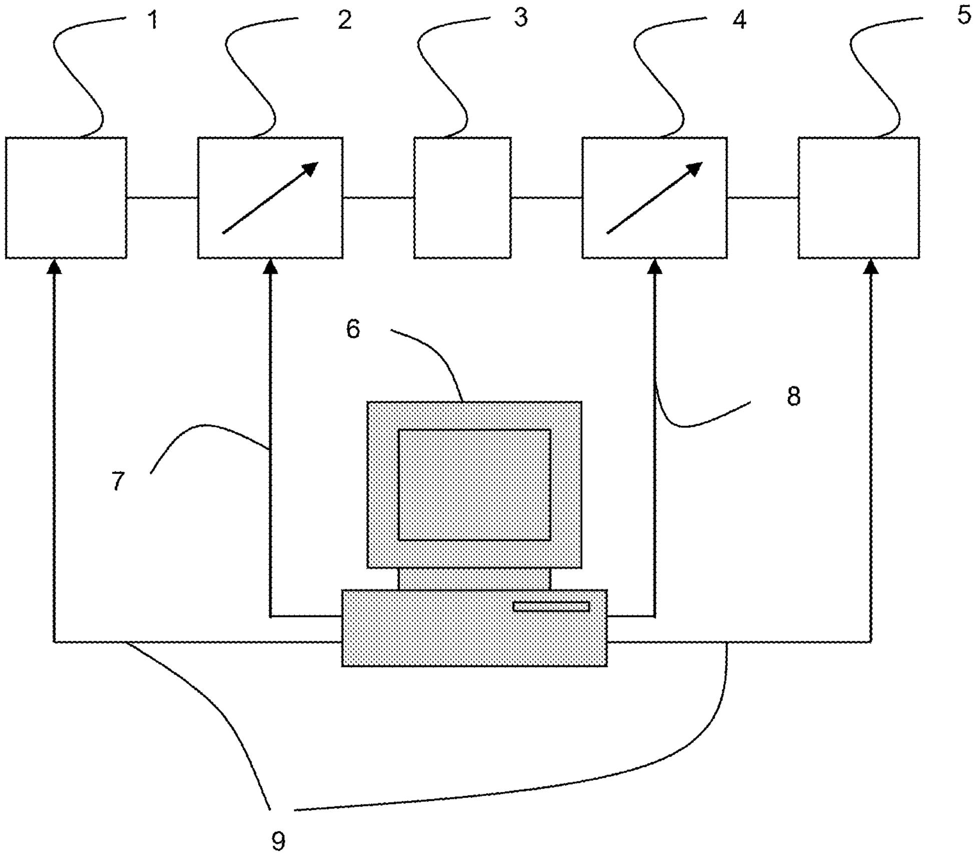
FIG. 1: Prior art

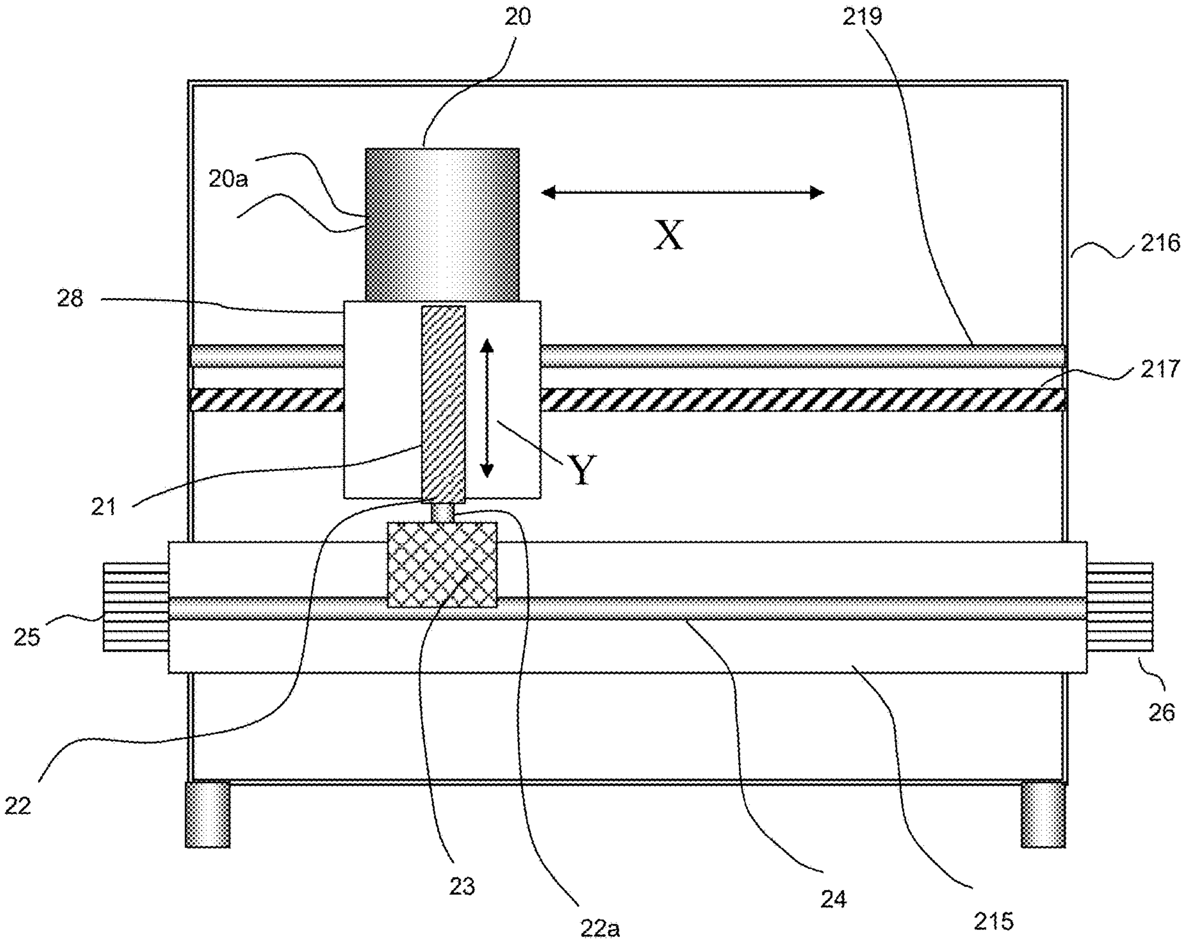
FIG. 2: Prior art

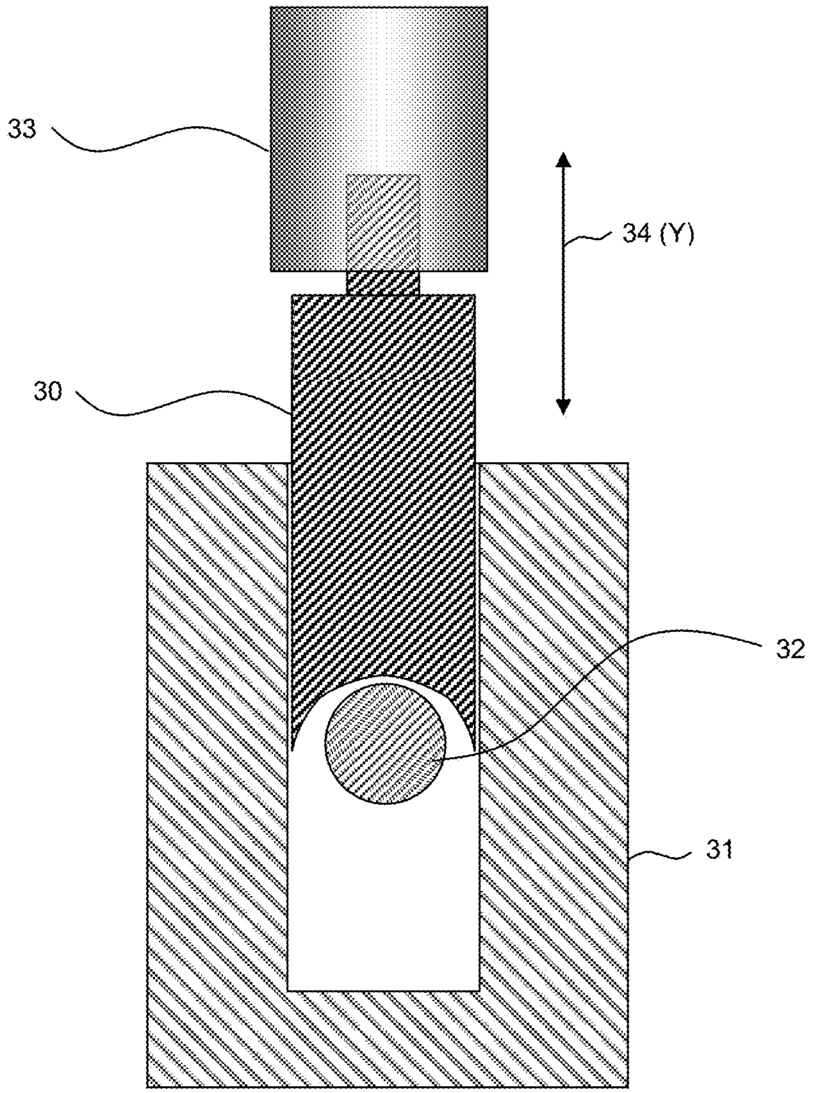
FIGURE 3: Prior art, cross section of RF probe and slotted airline (slabline) of slide screw tuner

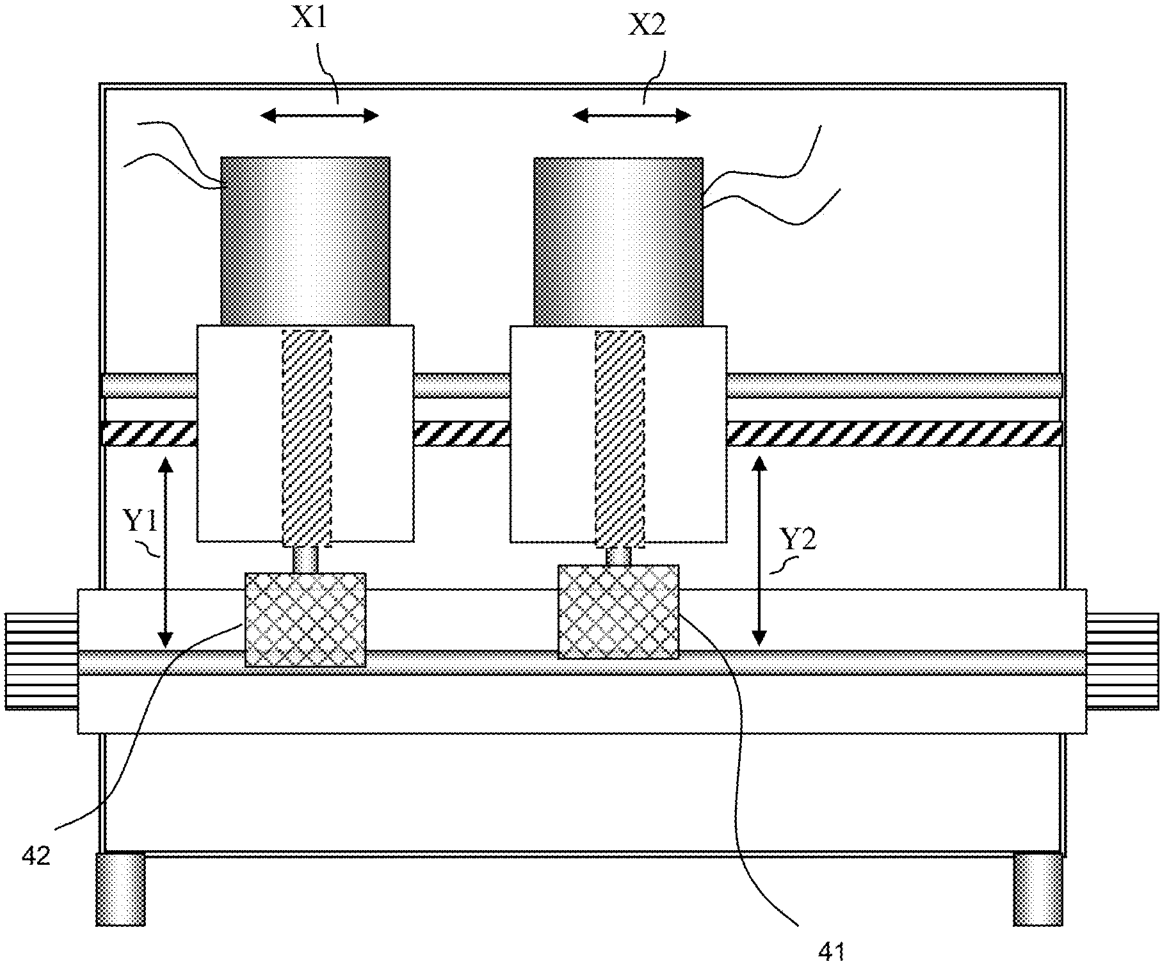
FIG. 4: Prior art

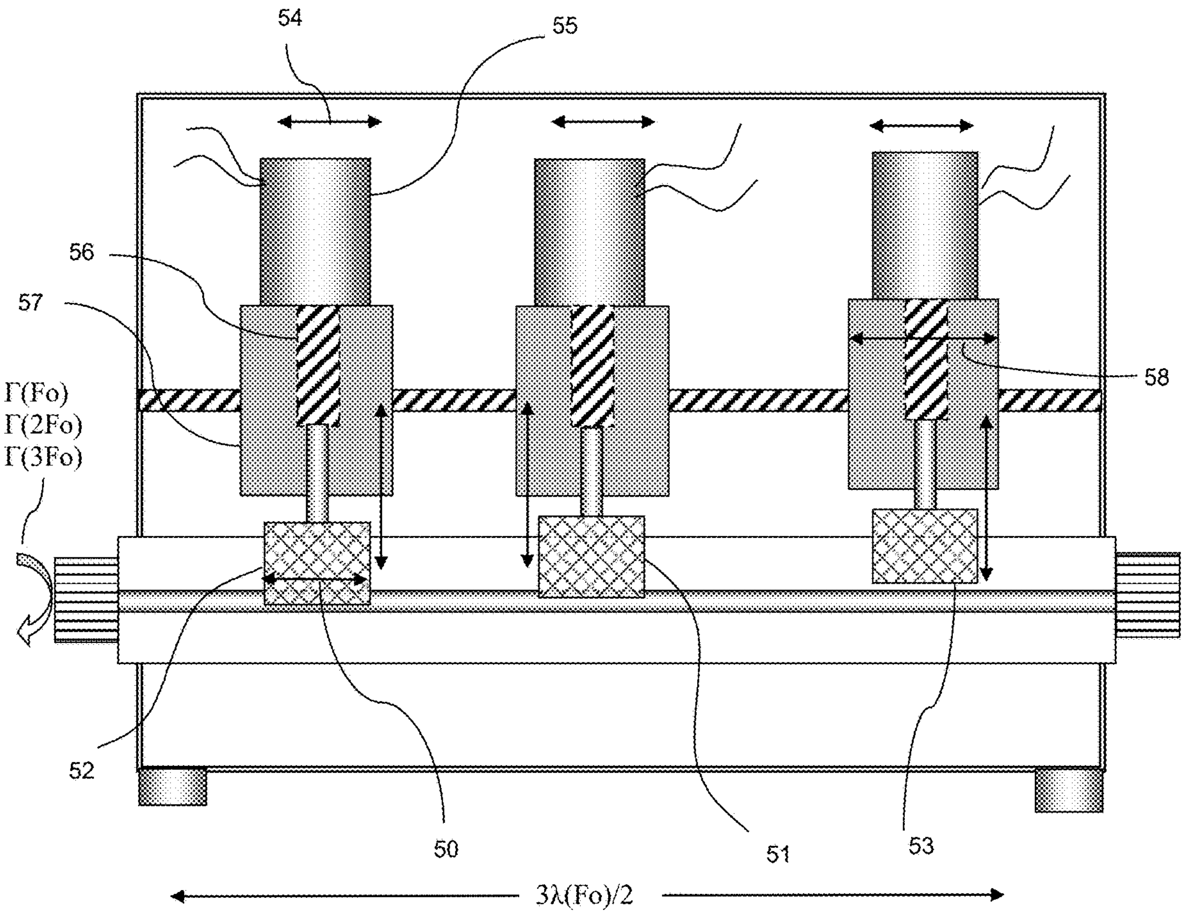
TOTAL LENGTH = 3*λ/2(Fo)+3 carriages
Ex. F1=Fo=1GHz : L=3*15cm+9cm = 53cm
Frequency: Fo=1-2GHz; 2Fo=2-4GHz; 3Fo=3-6GHz, all slugs must cover 1-6GHz
FIG. 5: Prior art FIG. 6A: Prior art
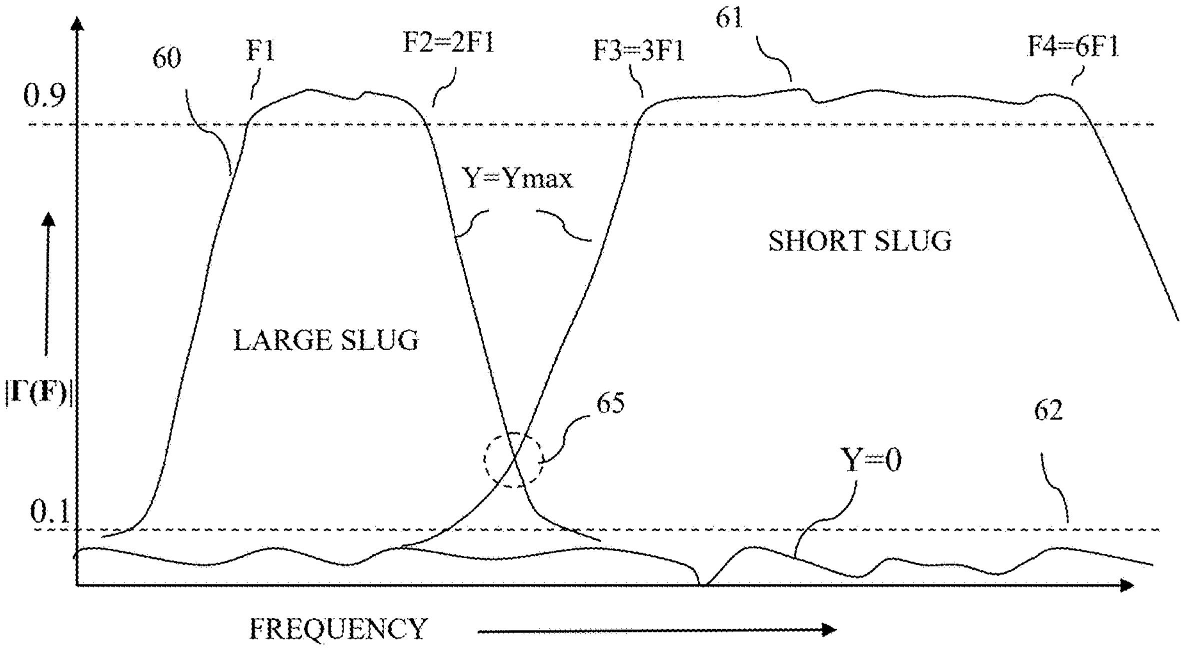
FIG. 6B: Prior art
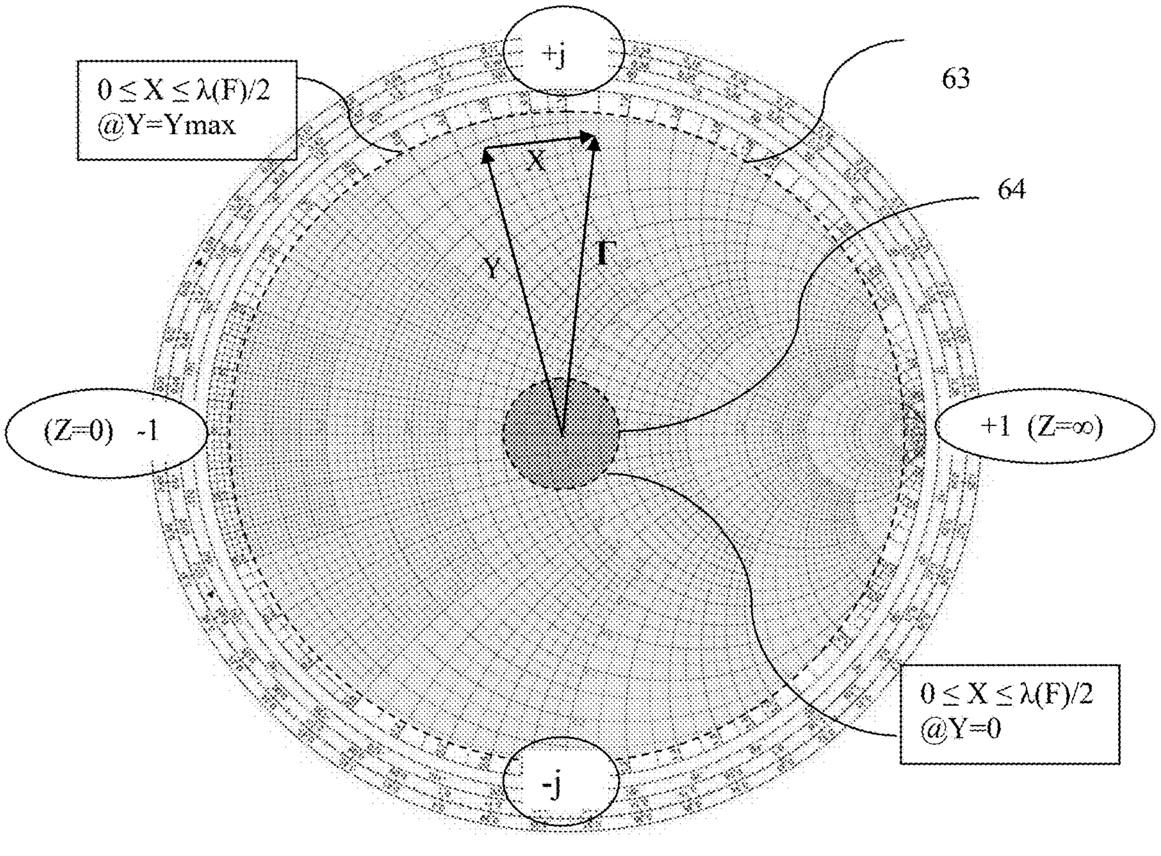

TOTAL LENGTH =2* λ/2(Fo)+λ/2(3Fo)+3carriages

Max length: F1=Fo=1GHz : L=2*15cm+5cm+9cm = 44cm

Frequency: Fo=1-4GHz; 2Fo=2-8GHz; 3Fo=3-12GHz; slugs #3 & #4 must cover 1-4 and 2-8GHz;
slugs #1 & #2 must cover 3-6GHz and 6-12GHz;
*tuner has 100% more bandwidth by adding the second slug*

FIG. 10: Prior art

WIDEBAND MIXED MODE HARMONIC TUNER

| FREQ RANGE Fo-2Fo & 3Fo | NEW VS OLD TRAVEL |
|---|---|
| **0.2-0.4**GHz & 0.6-1.2 GHz single slugs | 1.75<->2.25m |
| **0.2-0.8**GHz & 0.6-2.4GHz double slugs | 1.75<->2.25m |
| **0.3-0.6**GHz & 0.9-1.8GHz single slugs | 1.25<->1.5m |
| **0.3-1.2**GHz & 0.9-3.6GHz double slugs | 1.25<->1.5m |
| **0.6-1.2**GHz & 1.8-3.6 GHz single slugs | 58<->75cm |
| **0.6-2.4**GHz & 1.8-7.2GHz double slugs | 58<->75cm |
| **0.8-1.6**GHz & 2.4-4.8GHz single slugs | 44<->56cm |
| **0.8-3.2**GHz & 2.4-9.6GHz double slugs | 44<->56cm |
| **1-6**GHz & 3-18GHz single slugs | 35<->45cm |
| **1-12**GHz 3-36GHz double slugs | 35<->45cm |
| **6-12**GHz & 18-36 GHz single slugs | 5.8<->7.5cm |
| **6-24**GHz & 18-72GHz double slugs | 5.8<->7.5cm |
| **12-24**GHz & 36-72 GHz single slugs | 2.4<->3.75cm |
| **12-48**GHz & 36-144GHz N/A double slugs | 2.4<->3.75cm |
| **18-36**GHz & 54-108GHz single slugs | 1.9<->2.5cm |
| **18-72**GHz & 108-216GHz N/A double slugs | 1.9<->2.5cm |

FIG. 12

WIDEBAND MIXED MODE HARMONIC TUNER

PRIORITY CLAIM

Not Applicable

CROSS-REFERENCE TO RELATED ARTICLES

1. "Computer controlled microwave tuner CCMT", Product Note 41, Focus Microwaves, January 1998.
2. Tsironis, C. U.S. Pat. No. 7,053,628, "High reflection microwave tuner using metal-dielectric probe and method".
3. "MPT, a universal Multi-Purpose Tuner", Product Note 79, Focus Microwaves, October 2004, FIG. 3.
4. Tsironis, C. U.S. Pat. No. 9,625,556, "Method for Calibration and Tuning with Impedance Tuners".
5. "Three probe tuners tackle multiple tasks", Microwaves & RF Magazine, February 2005, page 90ff.

BACKGROUND OF THE INVENTION AND PRIOR ART

This invention relates to load pull testing of microwave power transistors using automatic microwave tuners for synthesizing reflection factors (or impedances) and match the transistors (device under test, or DUT) at the input and output at the fundamental and harmonic frequencies.

Modern design of high-power microwave amplifiers, oscillators and other active components used in various communication systems requires accurate knowledge of the active device's (microwave transistor's) characteristics. In such circuits, it is insufficient and inaccurate for the transistors operating at high power in their highly non-linear regions and close to saturation, to be described using analytical or numerical models only. Instead, the devices must be characterized using specialized test setups under the actual operating conditions.

A popular method for testing and characterizing transistors for high power operation is "load pull" and "source pull". Load pull or source pull are measurement techniques employing microwave impedance tuners 2, 4 and other microwave test equipment, like signal sources 1, an RF (Radio Frequency) load 5, control computer 6 and digital connections 7, 8, 9 between the computer and the tuners and test equipment. The microwave tuners 2, 4 in particular are used in order to manipulate the RF impedance conditions under which the DUT 3 is tested (FIG. 1).

Electro-mechanical tuners (see ref. 1) are used in most cases for high power load pull testing, because they have several advantages, such as long-term stability, higher handling of RF power, easier operation, and lower cost, compared to other type of tuners such as electronic and active tuners. FIG. 2 shows a front view and cross section of an automatic electro-mechanical tuner using the "slide-screw" tuning concept; a slotted airline (slabline) 215, with two RF connectors 25, 26 at both ends is embedded in a solid housing 216, which also comprises a mobile carriage 28 and means for horizontal drive, typically a lead screw 217; the carriage 28 slides smoothly on polished and grounded shafts 219. The carriage 28 comprises electrically driven **20*a* stepper motor 20, which is powered by a control computer 6, running appropriate software and controls the movement of a precise vertical axis 21. At the bottom end of the axis 22 an appropriate clamp 22*a* holds the RF probe (slug) 23 and secures its exact and repeatable positioning very close to the center conductor 24 of the slabline 215. Moving the slug 23 closer to the center conductor 24 increases the amplitude of the reflection factor and moving it along the axis of the slabline 215, at constant distance from the center conductor, controls its phase. The vertical probe control is shown in FIG. 3. FIG. 4** shows a slide screw tuner with two d=identical tuning probes that can be used either for very high reflection factors (pre-matching) or two-harmonic tuner (independent tuning at Fo and 2Fo).

A cross section of the 'slide screw' core of the tuner showing slabline, probe and vertical tuning mechanism is included in FIG. 3; in this configuration adjustable conductive or metallic obstacles (probes or "slugs") 30 are inserted into the transmission media of the tuners, which is a slotted coaxial or parallel plate airline (slabline) 31; the capacitive coupling between the vertical probe 30 and the central conductor 32 of the slotted airline (slabline) creates a wideband RF reflection factor (T) for the electromagnetic waves travelling along the slabline, of which the amplitude can be adjusted by inserting (or withdrawing) the probe 30 further into (or from) the slabline and reducing (or increasing) the gap between the probe 30 and the central conductor 32 and therefore increasing (or reducing) the value of the capacitance between the center conductor 32 and the probe 30; the phase of the reflection factor is controlled by moving the slug 30 along the slabline. The probe 30 is held and guided by the vertical axis 33 of the tuner and is moved vertically 34 by the axis 33, which is driven by a vertical lead screw and computer-controlled stepper motors, known in prior art (FIG. 3 in ref. 2), FIG. 2, 3.

The fundamental typical behavior of tuning slugs in slide screw tuners is summarized in FIGS. 6A and 6B: FIG. 6A shows the amplitude [Γ] of the reflection factor Γ created at the tuner test port by the tuning slug as a function of slug penetration into the slabline for two lengths of the slugs (short or large). The penetration of the slugs affects the amplitude of T and the length the slugs affects the frequency coverage. When the slug is withdrawn to vertical position Y=0, only a residual reflection $|\Gamma|<0.1$ exits; when it is inserted until just before shorting with the center conductor at Y=Ymax, it creates the maximum reflection $|\Gamma|\geq 0.9$. The effect of the length of the slugs is also shown. Short slugs create wideband reflection at the high frequency end. In the present invention the short slugs are used to reflect only the third harmonic frequency 3Fo; the larger slugs are used to reflect the fundamental Fo and the second harmonic frequency 2Fo. This configuration, disclosed in this invention, alleviates the requirement on the slugs to cover equally all the three harmonic frequencies and increases inherently the frequency coverage of the tuner; in prior art, to create a Fo-3Fo harmonic tuner, all slugs would have to cover equally all frequencies from Fo to 9Fo; in the present invention this is feasible by using two large slugs covering Fo to 2Fo and one short slug covering from 3Fo to 9Fo, a much easier requirement (FIG. 9).

DETAILED DESCRIPTION OF THE DRAWINGS

The present invention will be better understood in view of the detailed description of the drawings of which:

FIG. 1 depicts prior art: block diagram of a typical automated load pull test setup.

FIG. 2 depicts prior art: front view of automated slide screw tuner with a single vertical axis and probe.

FIG. 3 depicts prior art: cross section of capacitive RF probe inserted into a slotted airline (slabline) used in slide screw tuners.

FIG. 4 depicts prior art: front view of automated two-frequency (Fo&2Fo) harmonic slide screw tuner with two independent carriages, probes (slugs) and vertical axes.

FIG. 5 depicts prior art: front view of automated three-frequency harmonic (Fo&2Fo&3Fo) slide screw tuner with three independent carriages, probes (slugs) and vertical axes.

FIGS. 6A through 6B depict prior art, tuning dynamic and frequency range coverage of reflective tuning probes (slugs): FIG. 6A depicts minimum and maximum reflection factor at the test port of a short and a large slug as a function of frequency, FIG. 6B depicts the associated tuning range (coverage of the Smith chart) at an operation frequency.

Figure 7:
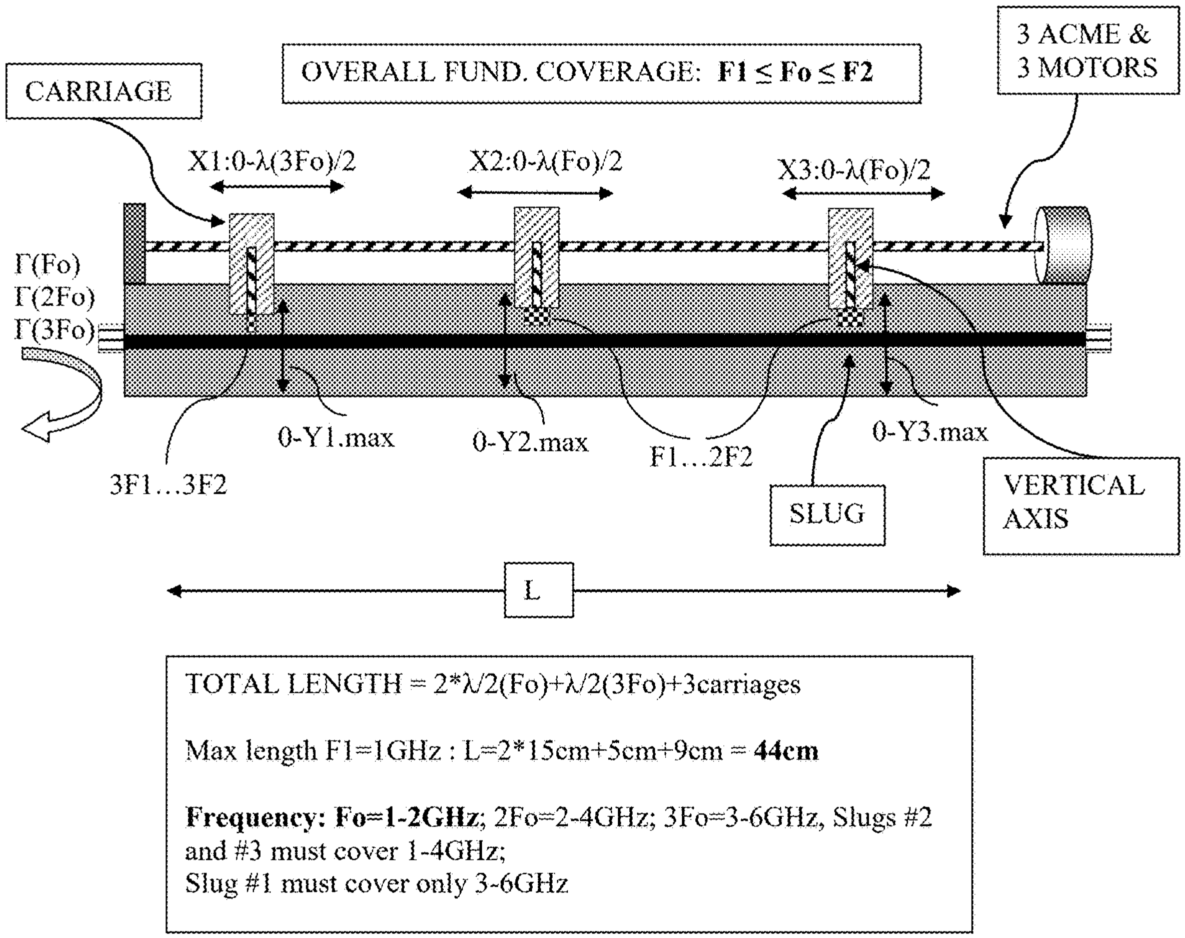
FIG. 7 depicts a front view schematics of the mixed operation three frequency compact harmonic tuner using two large and one short slug.

FIG. 12 depicts a list of examples of harmonic tuners using two single slugs covering one octave Fo-2Fo and one slug covering one octave at 3Fo only, instead of sets of three slugs covering 1.5 octaves each, and the associated reduction in required horizontal slug travel length; FIG. 12 also depicts the advanced embodiment where each carriage holds two independent slugs enhancing the overall frequency range.

DETAILED DESCRIPTION OF THE INVENTION

The term "wideband" must be specifically defined for this application: A "wideband RF component" typically means a component that has a constant or nearly constant characteristic over a wide frequency range; such as a "wideband amplifier" (having constant Gain over a wide frequency band) or a "wideband receiver" (having reception sensitivity over wide frequency band). The term "wideband" of course is relative and depends on the application, the component and state of the art: "a wideband amplifier" used to be one octave (F2/F1=2); it is now up to 5 octaves or more (F2/F1≈50). In the case of impedance tuners, to date, "wideband" means a tuner which is capable of creating significant reflection factor ($|\Gamma|$>0.85-0.9) over a large frequency range, such as 0.8-18 GHz or 6-40 GHz etc. As will be discussed later, however, this concerns only the amplitude of the reflection factor; instead, the phase of the reflection factor changes rapidly. If measurements are carried out at a single frequency this is irrelevant. But the bandwidth is important to be able to support many applications using the same equipment.

FIG. 5 shows the existing three-carriage, three identical probe (slug) tuner. This tuner can be used twofold: When the slugs are placed horizontally as to create three reflection factor vectors 120° off each-other, then any point (at the specific frequency) can be reached on the Smith chart, by moving the slug only vertically (see ref. 3), in which case the center of gravity of the tuner does not change during tuning, the tuner does not tilt and does damage the wafer probes when it is connected with. However, the three independent slugs also allow harmonic tuning (independent synthesis of impedances at 3 harmonic frequencies, Fo, 2Fo and 3Fo as long as all three slugs "cover" (=create high wideband reflection) at all three frequencies (see ref. 5); this is what the prior art tuner of FIG. 5 does: the three slugs 51, 52 and 53 have the same length 50 and cover the same frequency range, which is 1.5 octaves (Fmax/Fmin=3); each mobile carriage 57 includes a vertical axis mechanism 56, which controls the slug using vertical motors 55. The carriages have a typical width 58 of 3 cm and must move horizontally 54 at least one half of a wavelength at the lowest fundamental frequency Fo.min of the tuner operation: these facts dictate the required length of the slabline, being L=1.52λ(Fo)+3*3 cm (including the carriage width); At Fo=1 GHz this gives a free travel of 53 cm. In summary, to create a harmonic tuner covering the frequency range 1-2 GHz prior art requires three slugs covering 1-6 GHz and 53 cm free slabline travel.

To fully understand the tuning strategy of the new harmonic tuner one must see the basic frequency response of tuning slugs; FIG. 6A shown the minimum and maximum reflection factor over frequency at the test port of the slabline for a large slug 60 and a short slug 61, whereas the limit 62 shows the reflection when all slugs are withdrawn. When the slugs are withdrawn from the slabline we observe a wideband residual reflection caused by the slabline itself, the adapters etc., but not the slugs. When the slugs are inserted to maximum depth we observe a wideband reflection factor close or even above 0.9, or 90% of the signal is reflected back to the source. In terms of impedance a reflection factor of 1.0 corresponds, depending on the phase, to values Z between 0 and infinite: ($Z=(1+\Gamma)/(1-\Gamma)$). Between the minimum and maximum reflection, as seen in FIG. 6B, we have the tuning range of the specific slug. The image of FIG. 6B is representative for every frequency inside the covered bandwidth 60 or 61. It shows the tuning dynamic range between the circles 63 and 64. What is significant here is the fact that, if we use two large slugs we can tune two harmonic frequencies, and by cascading with a shorter slug we can tune independently the third harmonic frequency. This has two significant benefits: 1) the slugs can be less wideband and easier to align, and 2) whereas the necessary travel of equal slugs is always one half of a wave length at Fo, when using the mixed concept of the invention the third slug has only to travel ⅓ of the other two, resulting in a general formula of L=3X versus L'=2.33X, a size reduction of 0.66/3 or 22.3%, or the new embodiment requires for the 1-2 GHz harmonic tuner two slugs covering 1-4 GHz, one slug covering 3-6 GHz and 44 cm free travel, a significant simplification.

The simple embodiment of the mixed mode harmonic slide screw tuner is shown in FIG. 7. The tuner is called "mixed mode", because two large (low frequency) slugs are used to tune the fundamental (Fo) and the second harmonic (2Fo) frequency using the prior art multiplex tuning technique (an intelligent search algorithm identifies slug positions, amongst million permutations, that create two harmonic impedances), and a short high frequency slug is cascaded with the two large slugs and reflects only the third harmonic frequency (3Fo). As outlined before this alleviates the bandwidth requirement on the slugs (Fo-2Fo is 50% less bandwidth than Fo-3Fo) and saves 22% of travel length and by that of tuner size. The tuner of FIG. 7 has two large slugs each covering F1→F2 and one short slug covering 3F1→3F2. Because insertion loss increases with frequency and reduces the tuning range of the tuner (FIG. 6B), the short high frequency slug is placed first next to the test port at which the three harmonic reflection factors Γ(Fo) to Γ(3Fo) appear (see FIG. 7); the travel of the short slug is also ⅓ of the travel of the large slugs (λ(3Fo)=λ(Fo)/3). Knowing from experience that carriages are typically 3 cm wide, yields for a 1-2 GHz harmonic tuner a total length of 44 cm, instead of 53 cm of the same tuner made using prior art.

Figure 8:
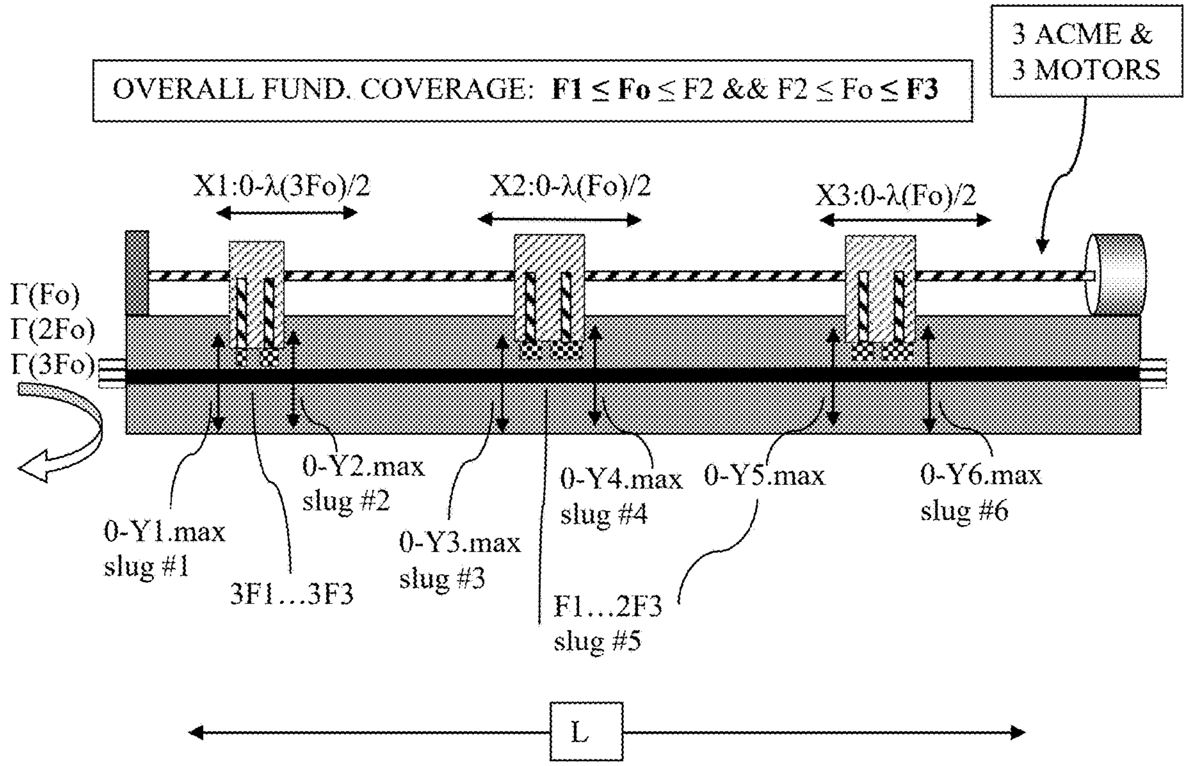
FIG. 8 depicts a front view schematics of the mixed mode operation three-frequency wideband compact harmonic tuner using two short and four large slugs allowing up to twice increased bandwidth (FIG. 12).

The advanced embodiment of the mixed mode harmonic tuner is shown in FIG. 8: each mobile carriage includes two independent vertical axes, each holding a tuning slug with its own maximum penetration Ymax; the two slugs of each carriage can be optimized to cover adjacent frequency bands and their harmonics and thus enhance further the instantaneous bandwidth of the tuner. For instance, a 1 to 2 GHz harmonic tuner requires: two slugs covering 1 to 4 GHz and one slug covering 3 to 6 GHz. The advanced embodiment adds a 2 to 4 GHz extension requiring two slugs 1 to 4 GHz and one slug 3 to 6 GHz, as before, and a new pair of slugs covering 2 to 8 GHz covering Fo from 2 to 4 GHz and one new slug covering 3Fo from 6 to 12 GHz, having materialized this way a two-octave 1 to 4 GHz harmonic tuner, twice as broadband as the simple embodiment, using ordinary and easy to align slugs. In any case the proposed calibration method does consider frequency response overlapping of the various slugs (65 in FIG. 6A), since it cannot be assumed that the frequency responses are fully not overlapping. This can be seen in FIG. 6A in the area 65.

Figure 9:
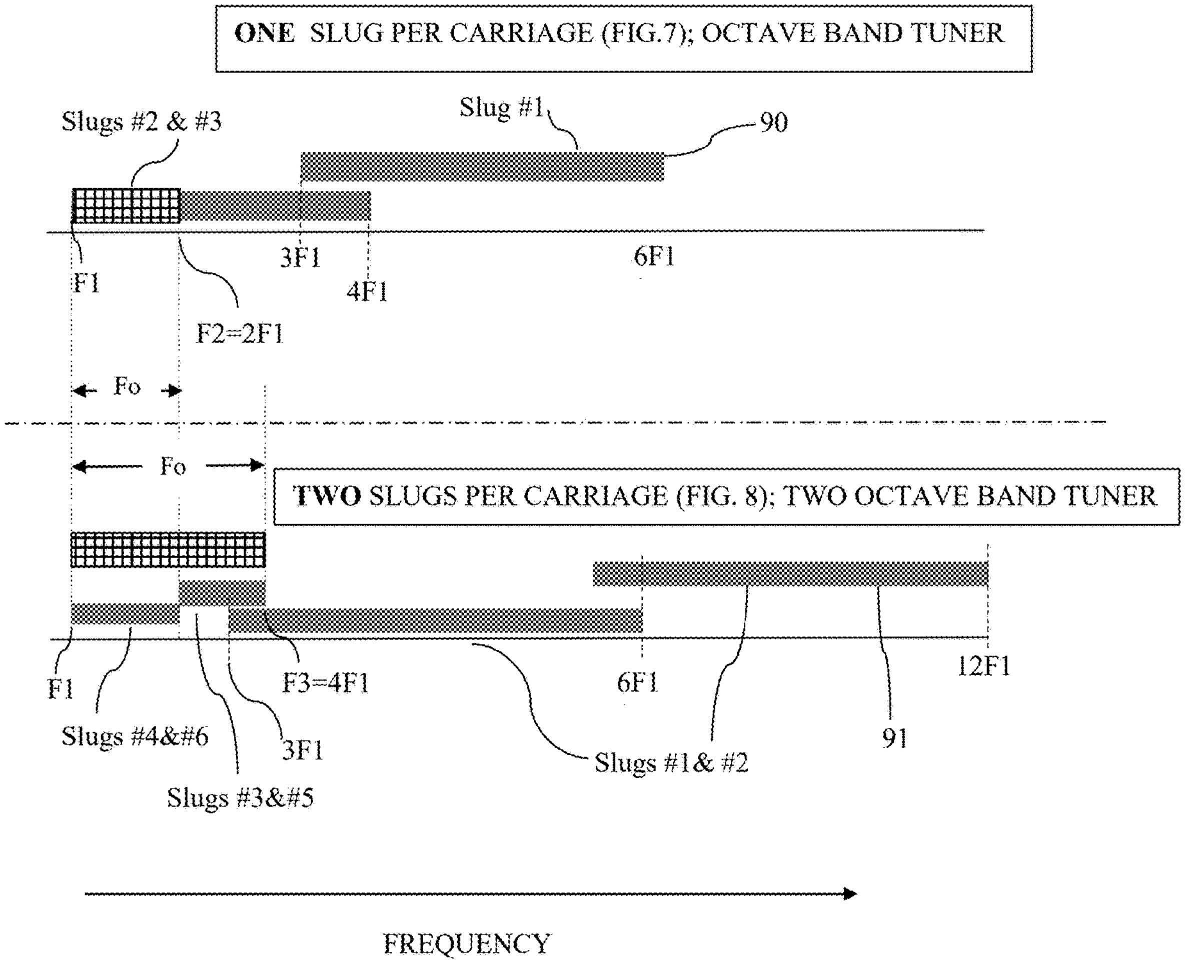
FIG. 9 depicts an overview of frequency coverage of the slugs in mixed operation single and double slug harmonic tuners.

FIG. 9 displays the frequency coverage of the single slug and the dual slug mixed mode harmonic tuner; a two-octave harmonic tuner is now feasible, limited only by the cutoff frequency of the used transmission lines. In the overlapping frequency ranges the tuning algorithms are fully capable of using numeric search for selecting the right slug positioning combinations in order to synthesize harmonic tuning. A further practical benefit of the mixed mode harmonic tuner operation is that the high frequency (3Fo) slug, which typically covers even higher frequencies (items 90, 91 in FIG. 9), can be used also beyond 3Fo as single frequency tuner.

Figure 10:
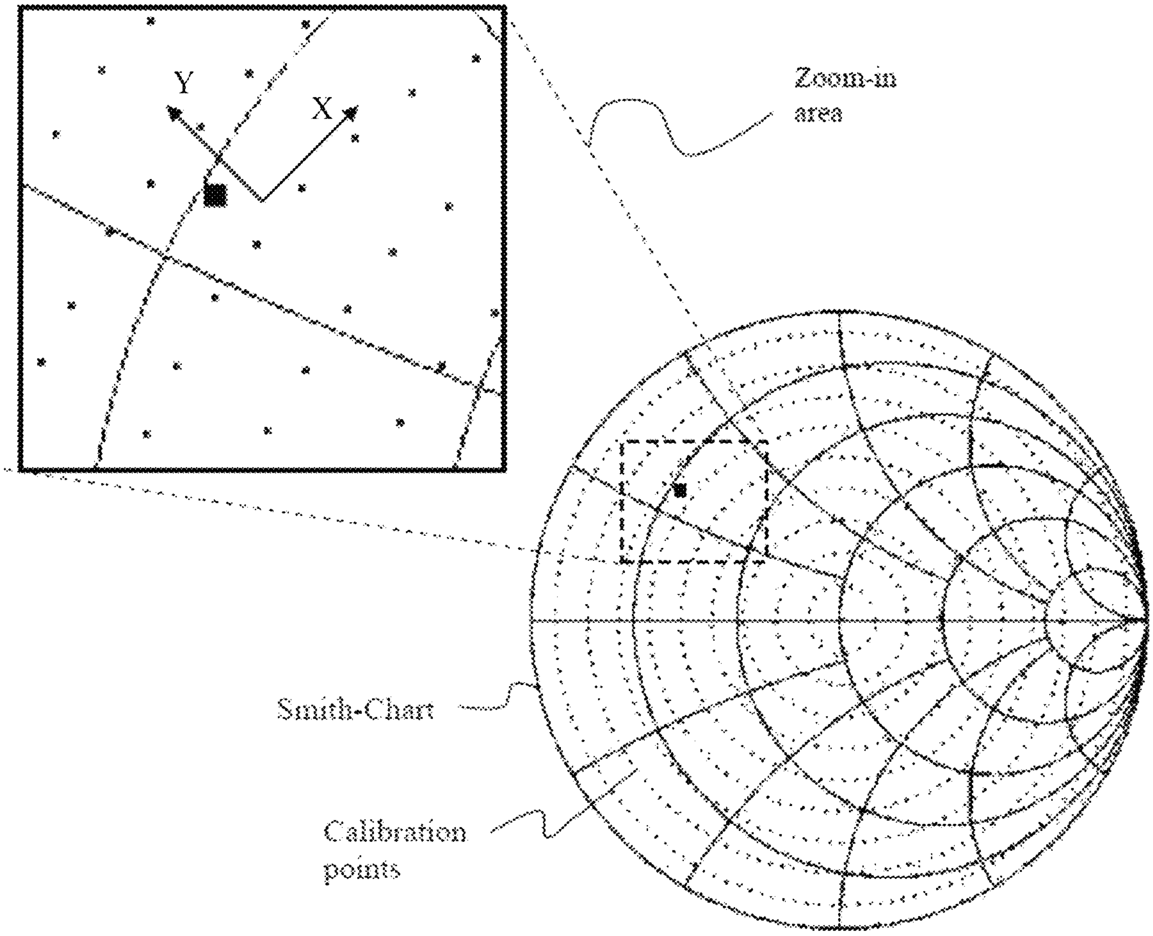
FIG. 10 depicts prior art: calibration points of a tuner at one frequency and projected cartesian slug coordinates into the polar Smith chart.
Figure 11:
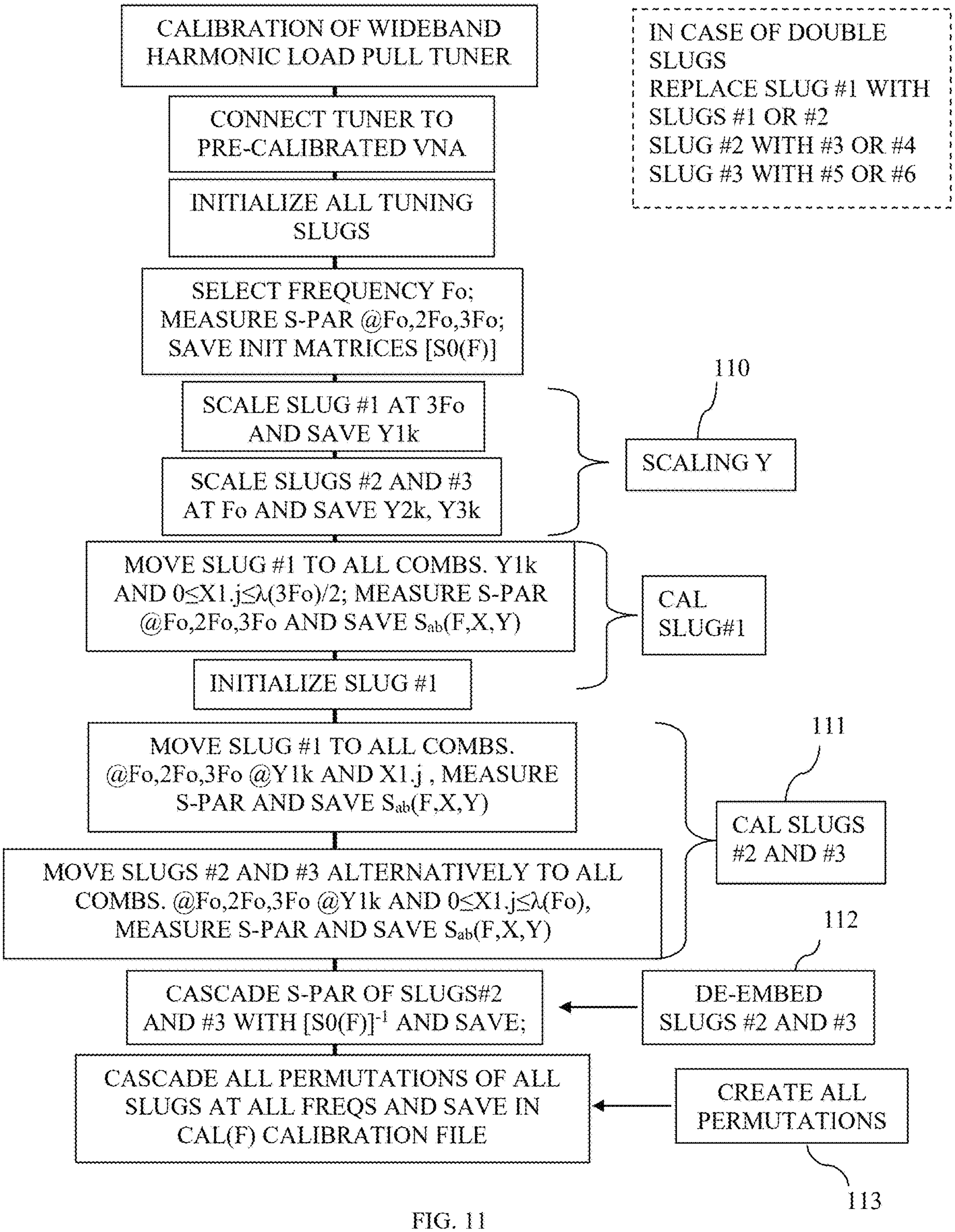
FIG. 11 depicts the flowchart of the calibration of the compact mixed operation three frequency harmonic tuner.

The mixed mode harmonic tuner calibration is summarized in the flowchart of FIG. 11 for a set of three harmonic frequencies (Fo, 2Fo, 3Fo): after connecting the tuner to the test ports of a pre-calibrated vector network analyzer (vector means that it can measure amplitude and phase of the forward and reverse travelling signals) all slugs are initialized, meaning that they are withdrawn from the slabline and the carriages are placed to pre-calculated initial horizontal positions Xi=0 (normally towards the test port), in a way to be able to move one half a wavelength at the frequency of interest without conflicting with adjacent carriages. In that state we measure s-parameters and save in an init matrix [S0(F)] for F=Fo, 2Fo and 3Fo. Subsequently each low frequency slug (#3 to #6) is scaled 110 at Fo (=finding slug penetrations for reflection factors between min and max reflection value) and coordinates Yi are saved; the high frequency slug is scaled at 3Fo; then the low frequency slugs are moved 111 in a multitude of horizontal and vertical positions to generate calibration patterns as shown in FIG. 10, and the same is done for the high frequency slugs (#1 or #2). Finally, the s-parameters collected for the low frequency slugs #2 and #3 are cascaded 112 for all frequencies with the inverse s-parameter init matrix $[S0(F)]^{-1}$ and saved. In a final step all s-parameters are cascaded 113 and saved in a turn calibration file containing s-parameters for all frequencies and all slug positions. The tuning routines use search algorithms from prior art (see ref. 4).

Specifically using the following steps:

1) connect the tuner to a pre-calibrated vector network analyzer (VNA);
2) define the calibration frequency Fo;
3) initialize all carriages j (j≤3) (move to dedicated horizontal zero positions Xj=0) and all the tuning probes (withdraw from the slabline to vertical zero positions Yk=0) (1≤k≤6); measure s-parameters at F=Fo, F=2Fo and F=3Fo and save in associated init matrices [S0(F)];
4) insert the first slug (k=1) gradually from the withdrawal state (Y1=0) to a state of maximal penetration (Y1=Y1max) into the slabline, measure and save vertical position levels at 3Fo (Y1.m(3Fo)) for a multitude N, with m=1,2 . . . N, of increasing reflection factors |Γm| between a minimum and a maximum value;
5) withdraw the first slug;
6) in a slug-positioning and s-parameter $S_{ab}$ measurement loop, whereby {a,b}={1,2}:
   for 1≤m≤N: insert the first slug to Y1.m(3Fo) and move the associated carriage j in a multitude of horizontal steps from the position zero (Xj=0) to a position Xj=λ(3Fo)/2, measure s-parameters at F=Fo, F=2Fo and F=3Fo and save $S_{ab}$ (F,Y1.m,Xj);
7) insert the second slug (k=2) gradually from the withdrawal state (Y2=0) to a state of maximal penetration (Y2=Y2max) into the slabline, measure and save vertical position levels at Fo (Y2.m(Fo)) for a multitude N, with m=1,2 . . . N, of increasing reflection factors |Γm| between a minimum and a maximum value;
8) withdraw the second slug;
9) in a slug positioning and s-parameter $S_{ab}$ measurement loop, whereby {a,b}={1,2}:
   for 1≤m≤N: insert the second slug to Y2.m(Fo) and move the associated carriage j in a multitude of horizontal steps from the position zero (Xj=0) to a position Xj=λ(Fo)/2, measure s-parameters at F=Fo, F=2Fo and F=3Fo and save $S_{ab}$ (F,Y2.m,Xj).

The tuning procedure (synthesis of user-defined impedances) uses calibrated points as well as interpolated points (FIG. 10). The calibration data by themselves do not suffice for high resolution detailed measurements, especially at Fo and partly at 2Fo. The number of calibration points is limited by the duration of the calibration process. If the total number of tuner states (distinct horizontal×vertical slug positions), which is on the order of a few millions (typically X varies from 0 to 2000-4000 and Y varies from 0 to 1500), would be calibrated, then the calibration routine would last several days or weeks. This is impractical and unacceptable. Therefore, we calibrate only a small fraction of possible slug positions (=tuner states). The slide screw tuner offers much higher resolution than the 1000 or 1500 calibration points would allow, which can be collected in reasonable time (10 to 30 minutes per frequency point). Still calibrating all possible permutations of the three slugs would drive the possible combinations into the billions, an impossible task. Using the de-embedding calibration technique, however, reduces the points to calibrate from, for instance, 1000×1000×1000=$10^9$ to 3×1000=3000 which is easily made. This technique is used regularly for multi probe tuners (see ref. 4) and includes the following steps: a) measuring the init matrix [S0(F)] at all frequencies Fo to 3Fo; b) measuring s-parameters of all slugs moved horizontally and vertically, firstly for scaling each slug (i.e. determining the slug penetration for defining a set of constant |Γ| circles on the Smith chart), and secondly covering the Smith chart with equidistant calibration points moving half a wavelength horizontally, and finally, after calibrating all slugs (FIG. 10), cascading s-parameters of slugs #2 and #3 with the inverse matrix [S0(F)] (de-embedding) the calibration finishes by cascading s-parameters of all slugs for all permutations of X and Y slug positioning for all frequencies and saving in a harmonic tuner calibration file. However, since slugs #1 or #2 (the high frequency slugs) only cover 3Fo they only need to move horizontally from 0 to λ(3Fo)/2 or one third of the movement of the lower frequency slugs #3 to #6, which only cover from Fo to 2Fo and must both move a larger distance from 0 to λ(Fo)/2.

The limited number of calibration points requires an interpolation to allow synthesizing the requested impedance with enough precision and resolution, even if the impedance point is not part of the calibration. The interpolation algorithm comprises two steps; given a target reflection factor (=impedance), in a first step a fast numeric search among all fixed calibration points allows to identify a grid of the 9 calibrated points closest to and surrounding the target impedance; in a second step and using the probe's horizontal (X) and vertical (Y) coordinates inside the slabline, a numerical, second order, interpolation algorithm is employed in order to calculate the s-parameters of the tuner two-port at any specific RF probe position with great accuracy; this is possible because the selected interpolation formulas describe accurately the natural behavior of the tuners, with its smooth and continuous dependence of s-parameters from horizontal and vertical positions of the RF probe (see ref. 4).

Finally, the table of FIG. 12 summarizes a comparison of possible harmonic tuners using the new embodiments using a single slug per carriage and the ultra-wideband mixed mode embodiment using double slugs per carriage compared with the prior art embodiment of using three equal wideband slugs.

Although the present invention has been explained hereinabove by way of a number of preferred embodiments, it should be pointed out that alternatives of the described components and methods are possible and, as far as obvious to a person skilled in the art, they shall not limit the scope of the present invention.

What is claimed is:

1. An automated multi-probe load pull tuner comprising:
a slabline with a center conductor linking a test port with an idle port, and
three remotely controlled mobile carriages, a first carriage, a second carriage and a third carriage, independently moving along the slabline, each including at least one remotely controlled vertical axis mechanism holding a reflective tuning probe and the first carriage being closest to the test port;
wherein
the reflective tuning probes consist of conductive parallelepiped slugs having a length along the slabline, a bottom surface mirroring the center conductor and being insertable into the slabline approaching the center conductor;
and wherein
each slug of each carriage can be moved horizontally and vertically independently on each slug of the other carriages, the slugs of the first carriage having a short length and the slugs of the second and third carriages having a large length;
and wherein
when a slug is approaching the center conductor, it covers (creates high reflection factor) a continuous frequency range between a frequency F1 and a higher frequency F2>F1;
and wherein
the slugs of the first carriage cover a frequency range between no less than F=3F1 and at least F=3F2, the slugs of the second and third carriages cover a frequency range between at least F=F1 and F=2F2, wherein F1 is any frequency between 0.2 GHz and 26 GHZ;
and wherein
the slugs of the first carriage have horizontal travel range of half a wavelength at 3Fo (λ(3Fo)/2), and the slugs of the second and third carriages have horizontal travel range at least one half a wavelength at Fo (λ(Fo)/2) each.

2. The multi-probe load pull tuner as in claim 1, wherein
the carriages include one independent vertical axis each, each vertical axis holding one tuning slug;
and wherein
the first carriage holds slug #1, the second carriage holds slug #2 and the third carriage holds slug #3.

3. The multi-probe load pull tuner as in claim 1, wherein
the carriages include two independent vertical axes each, each vertical axis holding one tuning slug;
and wherein
the first carriage holds slugs #1 and #2, the second carriage holds slugs #3 and #4 and the third carriage holds slugs #5 and #6;
and wherein
the two slugs of each carriage cover adjacent frequency bands.

4. The multi-probe load pull tuner as in claim 1, wherein
the carriages and vertical axes are controlled using electrical stepper motors and gear, the whole being operationally connected to a control processor (controller) through an electronic interface.

5. A calibration method for the load pull tuner of claim 2 for a set of three harmonic frequencies (F=Fo, 2Fo, 3Fo) comprising:
initialize the carriages (place closest to the test port) and the tuning slugs (withdraw from the slabline), measure and save init s-parameter matrices [S0(F)] of the tuner;
insert each slug alternatively into the slabline (scaling) while measuring for slug #1 at 3Fo and for slugs #2 and #3 at Fo, and saving a multitude of reflection factor values from minimum (slug withdrawal) to maximum (slug penetration close to the center conductor) and associated vertical scaling slug positions;
in a slug-positioning and s-parameter measurement loop place each slug to all permutations of the vertical scaling positions and a multitude of horizontal X positions for slug #1 from X1=0 to X1=λ(3Fo)/2 and for slugs #2 and #3 from X2, X3=0 to X2,X3=λ(Fo)/2 in order to create grids of calibration points of slugs #2 and #3 spreading over a Smith chart at Fo, and a grid of calibration points of slug #1 spread over the Smith chart at 3Fo, measure s-parameters at Fo, 2Fo and 3Fo, and save;

cascade the invers init matrix $[S0(F)]^{-1}$ with the s-parameters of slugs #2 and #3 and save;

create cascade permutations of s-parameters of the tuner associated with the totality of slug positions and harmonic frequencies and save in calibration files CAL (F).

6. A calibration method for the load pull tuner of claim 3 for a set of three harmonic frequencies (F=Fo, 2Fo, 3Fo) comprising:

initialize the carriages (place closest to the test port) and the tuning slugs (withdraw from the slabline), measure and save init s-parameter matrices [S0(F)] of the tuner;

insert each slug alternatively into the slabline (scaling) while measuring for slug #1 and #2 at 3Fo and for slugs #3 to #6 at Fo, and saving a multitude of reflection factor values from minimum (slug withdrawal) to maximum (slug penetration close to the center conductor) and associated vertical scaling slug positions;

in a slug-positioning and s-parameter measurement loop place each slug to all permutations of the vertical scaling positions and a multitude of horizontal X positions for slugs #1 and #2 from X1=0 and X2=0 to X1=λ(3Fo)/2 and X2=λ(3Fo)/2 and for slugs #3 to #6 from X3=0 to X6=0 to X3=λ(Fo)/2 to X6=λ(Fo)/2 in order to create grids of calibration points of slugs #3 to #6 spreading over a Smith chart at F=Fo, and a grid of calibration points of slugs #1 and #2 spreading over the Smith chart at F=3Fo, measure s-parameters at Fo, 2Fo and 3Fo, and save;

cascade the invers init matrix $[S0(F)]^{-1}$ with the s-parameters of slugs #3 to #6 and save;

create cascade permutations of s-parameters of the tuner associated with the totality of slug positions and harmonic frequencies and save in calibration files CAL(F).

* * * * *